(12) United States Patent
Hwang

(10) Patent No.: US 7,745,331 B2
(45) Date of Patent: Jun. 29, 2010

(54) METHOD FOR FABRICATING CONTACT PLUG IN SEMICONDUCTOR DEVICE

(75) Inventor: Chang-Youn Hwang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 681 days.

(21) Appl. No.: 11/646,062

(22) Filed: Dec. 27, 2006

(65) Prior Publication Data

US 2008/0003798 A1 Jan. 3, 2008

(30) Foreign Application Priority Data

Jun. 30, 2006 (KR) .................. 10-2006-0060291

(51) Int. Cl.
*H01L 21/44* (2006.01)
(52) U.S. Cl. .............. 438/672; 438/233; 438/586; 438/597; 257/E21.578
(58) Field of Classification Search ............ 438/233, 438/586, 597, 672
See application file for complete search history.

(56) References Cited

U.S. PATENT DOCUMENTS

2003/0129825 A1* 7/2003 Yoon ................... 438/626
2005/0280035 A1* 12/2005 Lee et al. ............ 257/208

FOREIGN PATENT DOCUMENTS

| KR | 10-2005-0116314 | 12/2005 |
| KR | 10-2006-0008556 | 1/2006 |
| KR | 10-2006-0072383 | 6/2006 |

* cited by examiner

*Primary Examiner*—Alexander G Ghyka
(74) *Attorney, Agent, or Firm*—Blakely, Sokoloff, Taylor & Zafman LLP

(57) ABSTRACT

An insulation layer including a landing plug is formed over a substrate. An amorphous carbon hard mask is formed over a certain portion of the insulation layer. The insulation layer is etched using the amorphous carbon hard mask to form a storage node contact hole exposing the landing plug. A conductive material is formed in the storage node contact hole to form a storage node contact plug. Other embodiments are also described.

10 Claims, 7 Drawing Sheets

'A'

'B'

METHOD FOR FABRICATING CONTACT PLUG IN SEMICONDUCTOR DEVICE

CROSS-REFERENCE TO RELATED APPLICATIONS

The present invention claims priority of Korean patent application number 10-2006-0060291, filed on Jun. 30, 2006, which is incorporated by reference in its entirety.

BACKGROUND OF THE INVENTION

The present invention relates to a method for fabricating a semiconductor device, and more particularly, to a method for fabricating a storage node contact plug in a semiconductor device.

A contact is generally required to have a certain size or less in order to maintain an overlap margin with a landing plug isolation layer, i.e., an under layer, when forming a storage node contact plug. The size of an upper portion of the storage node contact plug is usually required to be larger than a certain level in order to secure an overlap margin with a subsequent storage node, and to secure a desired contact resistance. Accordingly, an additional plug pad process has been performed on an insulation layer such that the storage node contact plug and the storage node may improve the above difficulty. However, the additional plug pad process causes an increased number of processes and increased development costs, decreasing the throughput.

Furthermore, when the size of a storage node contact mask is increased to maintain the size of the upper portion of the storage node contact plug, a bridge may be generated between adjacent storage node contact plugs because of a lack of margin between storage node contact holes after performing an etching process to form the storage node contact holes.

Also, the increased size of the storage node contact plug may cause a lack of margin with the landing plug isolation layer, i.e., the under layer. Accordingly, an etch loss may be generated on the landing plug isolation layer during the etching process for forming the storage node contact holes (refer to 'A' shown in FIG. 1).

SUMMARY OF THE INVENTION

Embodiments of the present invention are directed to provide a method for fabricating a contact plug in a semiconductor device, which can maintain an overlap margin between a storage node contact plug and a landing plug isolation layer, and reduce etch loss of the landing plug isolation layer during an etching process for forming a storage node contact hole.

In accordance with an aspect of the present invention, there is provided a method for fabricating a contact plug in a semiconductor device, including: forming an insulation layer over a substrate, the insulation layer including a landing plug; forming an amorphous carbon hard mask over a certain portion of the insulation layer; etching the insulation layer using the amorphous carbon hard mask to form a storage node contact hole exposing the landing plug; and forming a conductive material in the storage node contact hole to form a storage node contact plug.

DESCRIPTION OF SPECIFIC EMBODIMENTS

The present invention relates to a method for fabricating a contact plug in a semiconductor device. According to an embodiment of the present invention, a storage node contact hole having a line width that gradually narrows from an upper portion toward a bottom portion is formed using an amorphous carbon hard mask defining a desired line width as an etch barrier. Consequently, an overlap margin between a storage node contact plug and a storage node may be improved, increasing yield. Also, an overlap margin between the storage node contact plug and a landing plug isolation layer may be secured by forming the storage node contact hole having the line width that narrows from the upper portion toward the bottom portion. Moreover, a typical poly pad formation process may be omitted, and thus, production costs may be decreased due to process stabilization and simplification.

FIGS. 2A to 2D illustrate cross-sectional views showing a method for fabricating a contact plug in a semiconductor device in accordance with an embodiment of the present invention.

Figure 1:
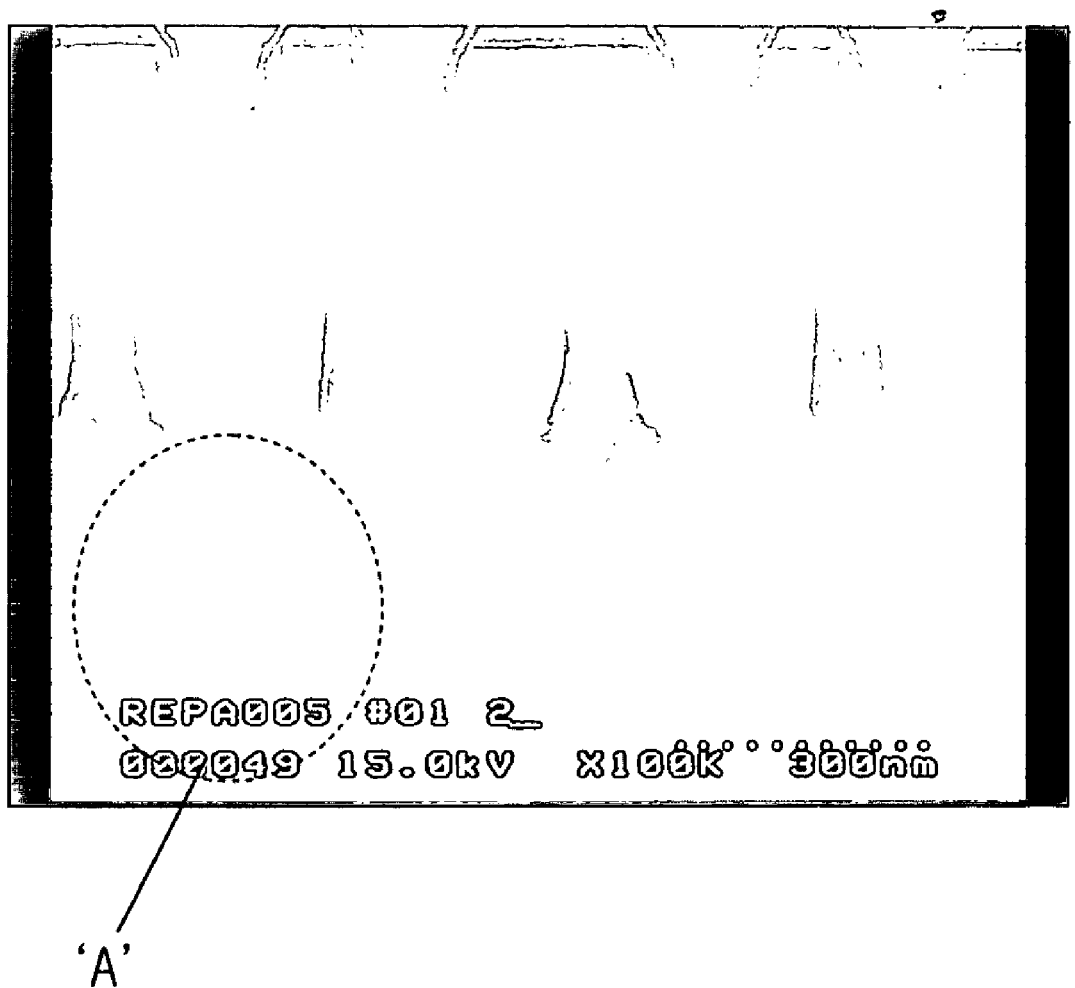
FIG. 1 illustrates a micrographic view showing a limitation of a typical method.
Figure 2A:
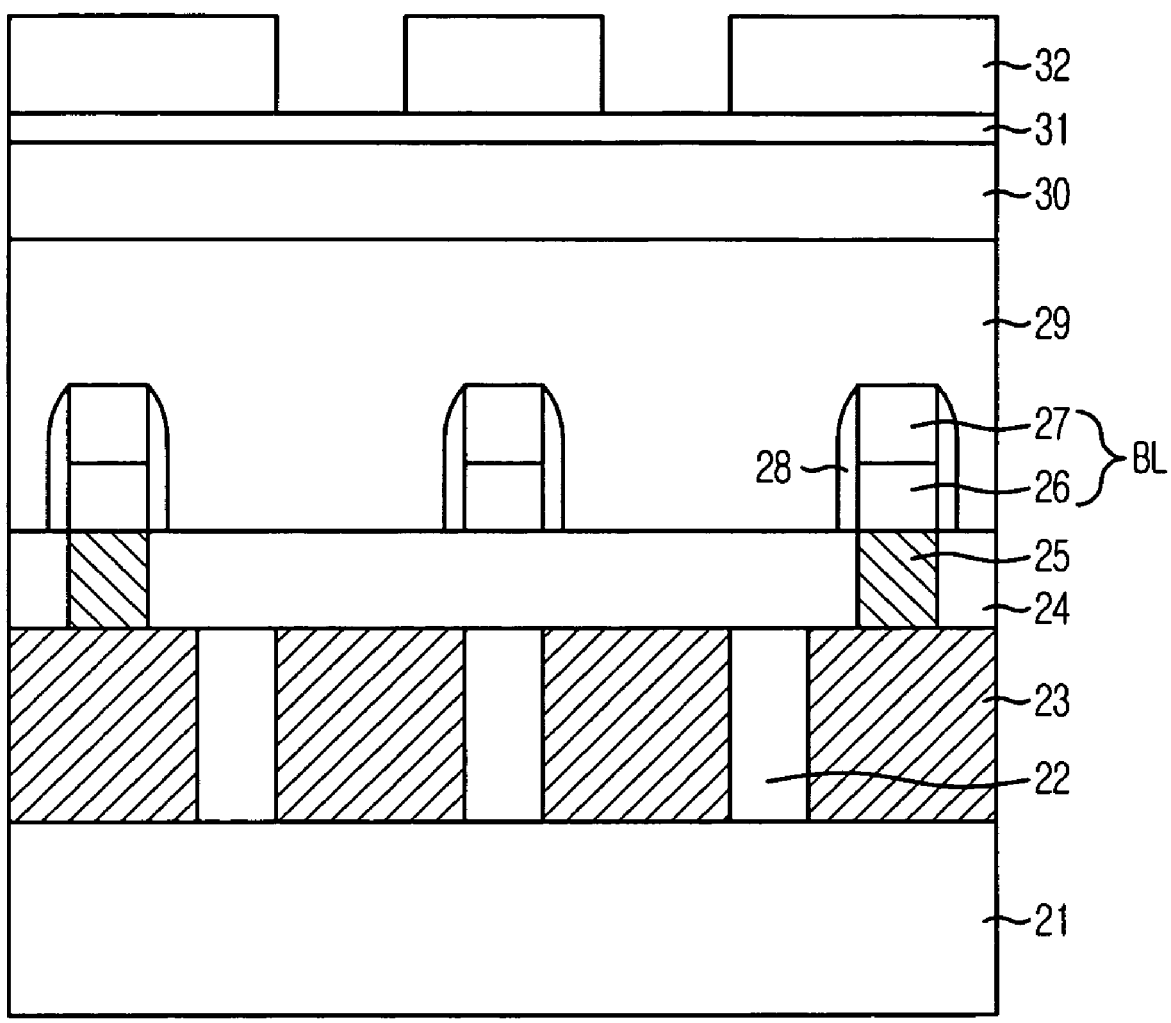
FIGS. 2A to 2D illustrate cross-sectional views showing a method for fabricating a contact plug in a semiconductor device in accordance with an embodiment of the present invention.

Referring to FIG. 2A, a plurality of gate lines (not shown) are formed over a semi-finished substrate 21 including wells and device isolation structures. A first inter-layer insulation layer is formed over the substrate 21 and the gate lines. An etching process for forming landing plug contacts (LPC) is performed on portions of the first inter-layer insulation layer, forming landing plug contact holes and a patterned first inter-layer insulation layer 22. The etched portions of the first insulation layer are predetermined for forming landing plugs. A conductive material, e.g., a polysilicon layer, is filled in the landing plug contact holes to form landing plugs 23. Hereinafter, the patterned first inter-layer insulation layer 22 is referred to as the landing plug isolation layer 22.

A second inter-layer insulation layer is formed over the landing plugs 23 and the landing plug isolation layer 22. Certain portions of the second inter-layer insulation layer are etched to form bit line contact holes and a patterned second inter-layer insulation layer 24. Bit line contacts 25 are formed in the bit line contact holes by forming a barrier metal including titanium (Ti)/titanium nitride (TiN) and a conductive material in the bit line contact holes. The barrier metal has a thickness ranging from approximately 100 Å to approximately 1,000 Å. Meanwhile, portions of the bit line contacts 25 and the landing plugs 23 are electrically coupled.

Bit lines BL are formed over certain portions of the patterned second inter-layer insulation layer 24. Each bit line BL includes a bit line tungsten layer 26 and a bit line hard mask 27. The bit line tungsten layer 26 is formed to a thickness ranging from approximately 300 Å to approximately 1,000 Å, and the bit line hard mask 27 is formed to a thickness ranging from approximately 1,500 Å to approximately 3,500 Å. The bit line hard mask 27 is formed by employing an etch recipe including a pressure ranging from approximately 20 mT to approximately 70 mT and a power ranging from approximately 300 W to approximately 1,000 W using a gas mixture including tetrafluoromethane ($CF_4$)/fluoroform ($CHF_3$)/oxygen ($O_2$)/argon (Ar). The bit line tungsten layer 26 is formed by employing an etch recipe including a pressure ranging from approximately 20 mT to approximately 70 mT and a power ranging from approximately 300 W to approximately 1,000 W using a gas mixture including sulfur hexafluoride ($SF_6$)/trichloroborane ($BCl_3$)/nitrogen ($N_2$)/chlorine ($Cl_2$). Bit line spacers 28 are formed on both sidewalls of the bit lines BL. The bit line spacers 28 include a nitride-based layer having a thickness ranging from approximately 50 Å to approximately 150 Å.

A third inter-layer insulation layer 29 is formed over the bit lines BL and the patterned second inter-layer insulation layer 24. The third inter-layer insulation layer 29 includes a high density plasma (HDP) oxide layer having a thickness ranging from approximately 4,000 Å to approximately 10,000 Å. The third inter-layer insulation layer 29 functions to insulate the bit lines BL. A chemical mechanical polishing (CMP) process is performed to planarize an upper portion of the third inter-layer insulation layer 29.

An amorphous carbon layer 30 is formed over the third inter-layer insulation layer 29. The amorphous carbon layer 30 is formed to a thickness ranging from approximately 1,000 Å to approximately 2,000 Å. A silicon oxynitride (SiON) layer 31 is formed over the amorphous carbon layer 30. The SiON layer 31 functions as an anti-reflective coating layer. A photoresist pattern 32 is formed over certain portions of the SiON layer 31. The photoresist pattern 32 is formed as a hole type pattern.

Figure 2B:
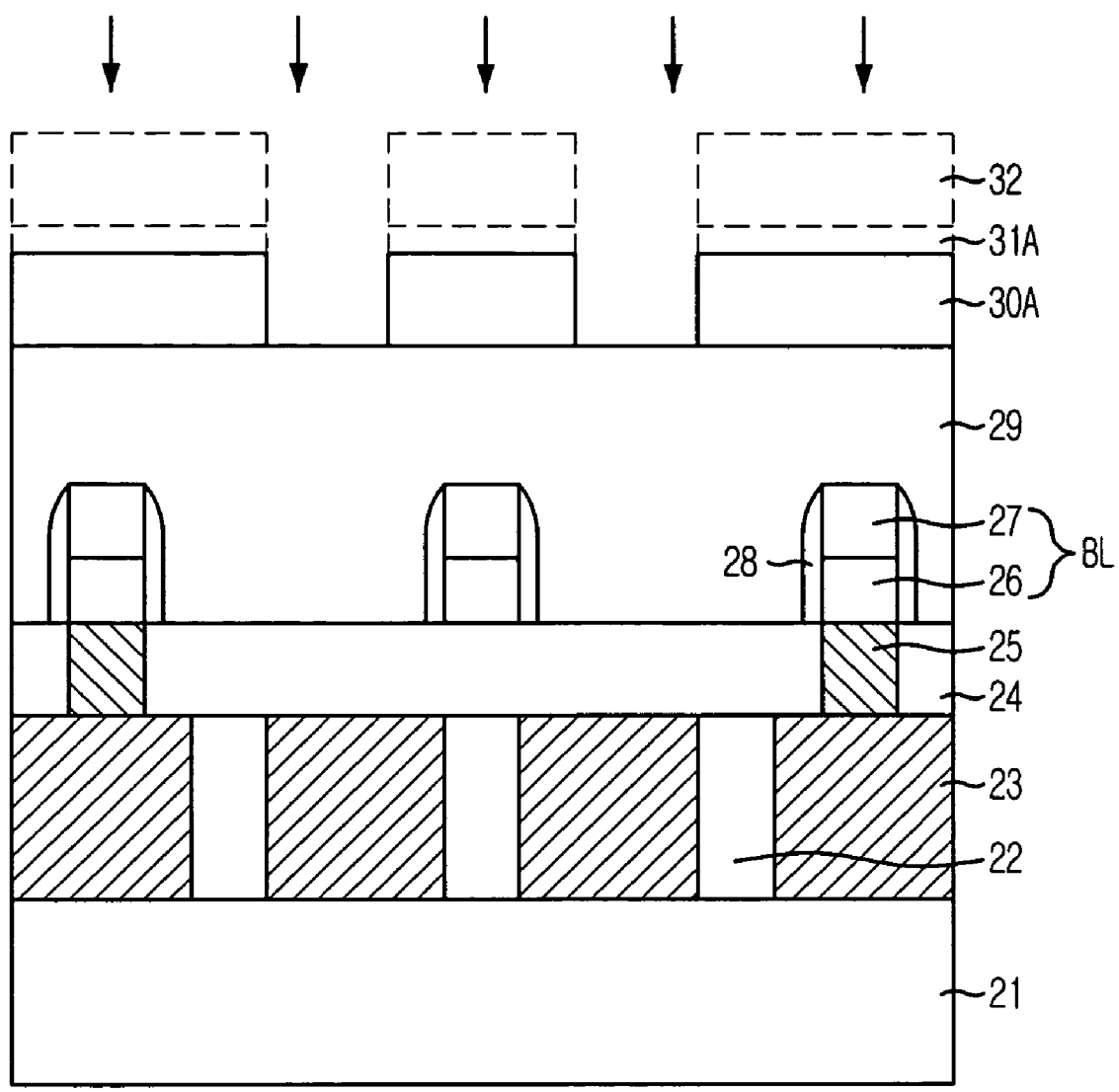

Referring to FIG. 2B, the SiON layer 31 and the amorphous carbon layer 30 are etched using the photoresist pattern 32 as an etch barrier to form a patterned SiON layer 31A and an amorphous carbon hard mask 30A. The amorphous carbon layer 30 is etched by supplying a power ranging from approximately 200 W to approximately 2,000 W at a pressure ranging from approximately 10 mT to approximately 200 mT using an etch gas including carbon and fluorine. The etch gas includes $CF_4/CHF_3/Ar/O_2/N_2$. The amorphous carbon hard mask 30A having a vertical profile may be formed because such etch gas is used to etch the amorphous carbon layer 30. At this time, a certain thickness of the third inter-layer insulation layer 29 may be etched (for a thickness 'P1' shown in FIG. 2C, ranging from approximately 500 Å to approximately 1,500 Å.) After the amorphous carbon layer 30 is etched, the photoresist pattern 32 is removed and a cleaning process is performed. The patterned SiON layer 31A is removed at this time.

Figure 2C:
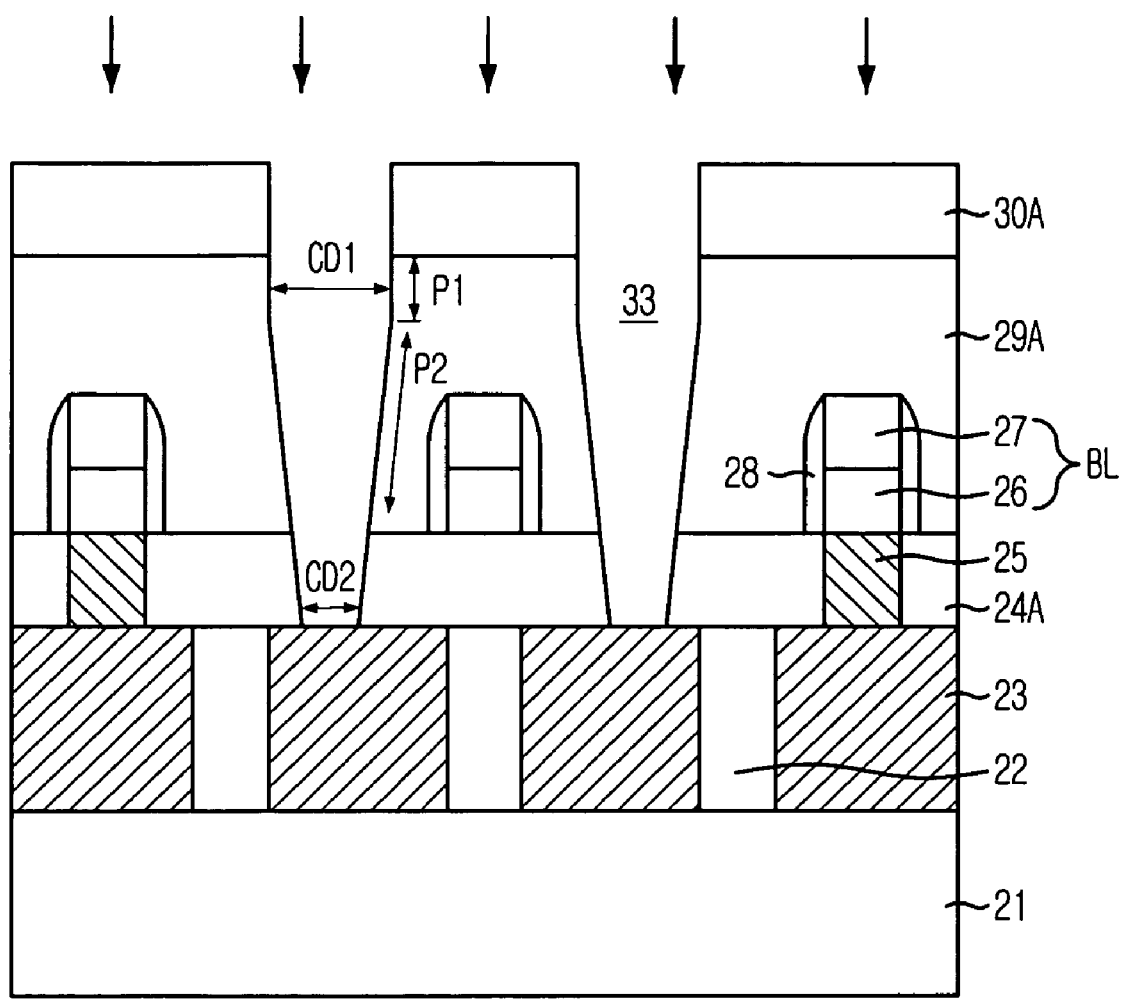

Referring to FIG. 2C, an etching process for forming contact holes is performed. The etching process includes etching the third inter-layer insulation layer 29 and the patterned second inter-layer insulation layer 24 using the amorphous carbon hard mask 30A as an etch barrier to form storage node contact holes 33 exposing a top portion of the landing plugs 23. Reference denotations 29A and 24A refer to a patterned third inter-layer insulation layer and a second inter-layer insulation pattern. The etching process for forming the storage node contact holes 33 includes supplying a power ranging from approximately 1,000 W to approximately 2,000 W at a pressure ranging from approximately 15 mT to approximately 50 mT using an etch gas including carbon and fluorine. The etch gas includes $Ar/O_2$/carbon monoxide (CO)/$N_2$ added to a gas selected from a group consisting of $C_4F_8$, $C_5F_8$, $C_4F_6$, and $CH_2F_2$.

Thus, the storage node contact holes 33 are formed with an upper portion having a vertical profile 'P1' and a bottom portion having a sloped profile 'P2'. The sloped profile 'P2' is formed in a manner that a line width of the storage node contact holes 33 gradually narrows toward the bottom. The sloped profile 'P2' is formed because polymers are formed from a reaction between the etch gas and the amorphous carbon hard mask 30A. Thus, a bottom line width CD2 gradually decreases toward the bottom when compared to an upper line width CD1 of the storage node contact holes 33, forming the contact holes having a wine glass structure.

By forming the storage node contact holes 33 with the upper line width CD1 larger than the bottom line width CD2, a contact margin between subsequent storage node contact plugs to be formed in the storage node contact holes 33 and subsequent storage nodes to be formed over the storage node contact plugs may be maintained. Also, an overlap margin between the landing plug isolation layer 22, which is an under layer, and the storage node contact plugs may be maintained.

Figure 2D:
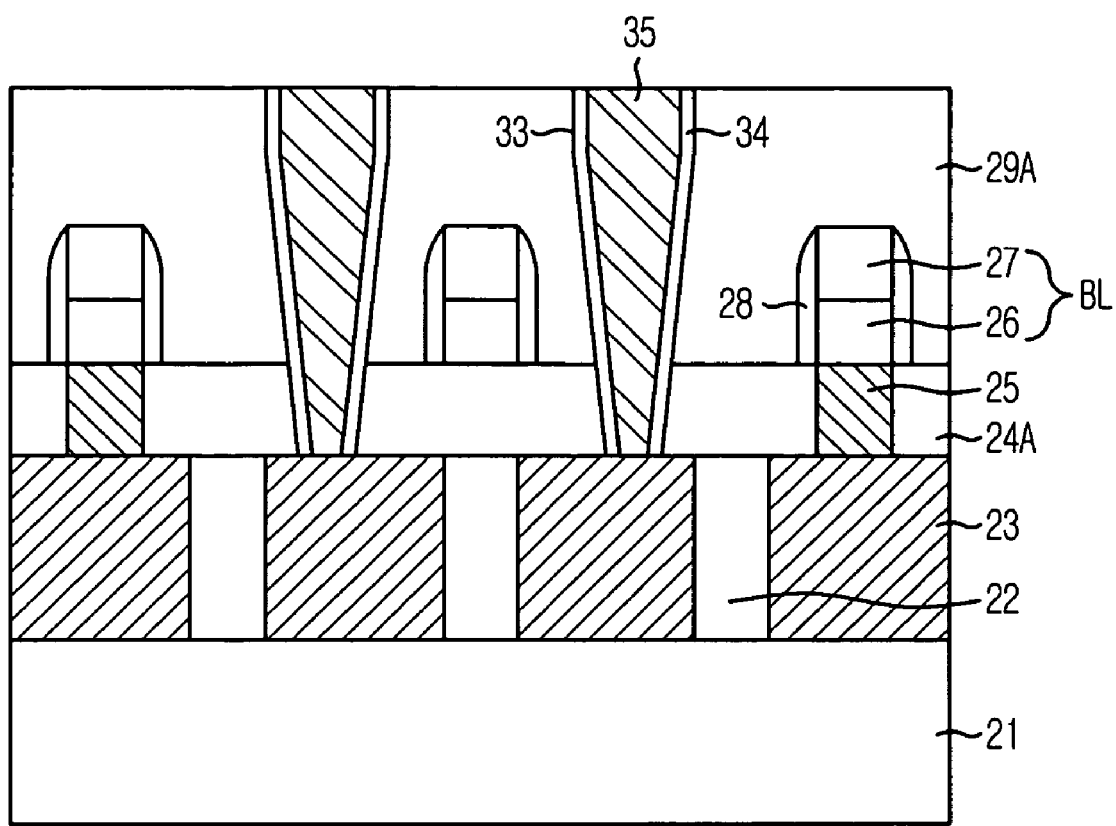

Referring to FIG. 2D, a nitride-based layer for use as storage node contact spacers is formed over a surface of the storage node contact holes 33. The nitride-based layer has a thickness ranging from approximately 100 Å to approximately 300 Å. The nitride-based layer is etched by supplying a power ranging from approximately 300 W to approximately 1,000 W at a pressure ranging from approximately 10 mT to approximately 30 mT using an etch gas including $CF_4/CHF_3/O_2/Ar$. Consequently, storage node contact spacers 34 are formed over sidewalls of the storage node contact holes 33.

A conductive material is formed in the storage node contact holes 33. For instance, the conductive material may include a polysilicon layer having a thickness ranging from approximately 1,500 Å to approximately 3,000 Å. An isolation process is performed using an etch-back process on the conductive material to form storage node contact plugs 35.

FIGS. 3A to 3D illustrate micrographic views to describe an embodiment of the present invention in amplification.

Figure 3A:
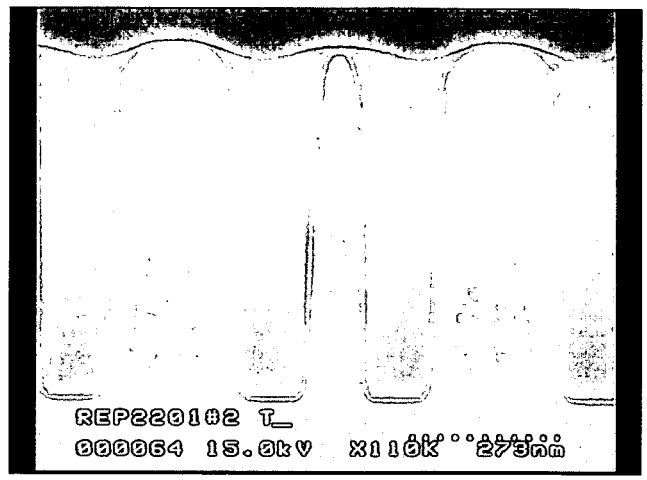
FIGS. 3A to 3D illustrate micrographic views to describe the embodiment of the present invention in amplification.

Referring to FIG. 3A, when using a polysilicon layer as the hard mask for forming the storage node contact, polymer is almost not generated during a self-aligned contact (SAC) etching process of the storage node contact holes 33. Thus, it may be difficult to form a sloped profile. Accordingly, when the line width of the storage node contact holes 33 increases, the upper and bottom portions of the storage node contact holes 33 may be formed with a vertical profile. Thus, etch loss of the landing plug isolation layer 22 may be generated due to a lack of an overlap margin between the landing plug isolation layer 22 and the storage node contact plugs.

Figure 3B:
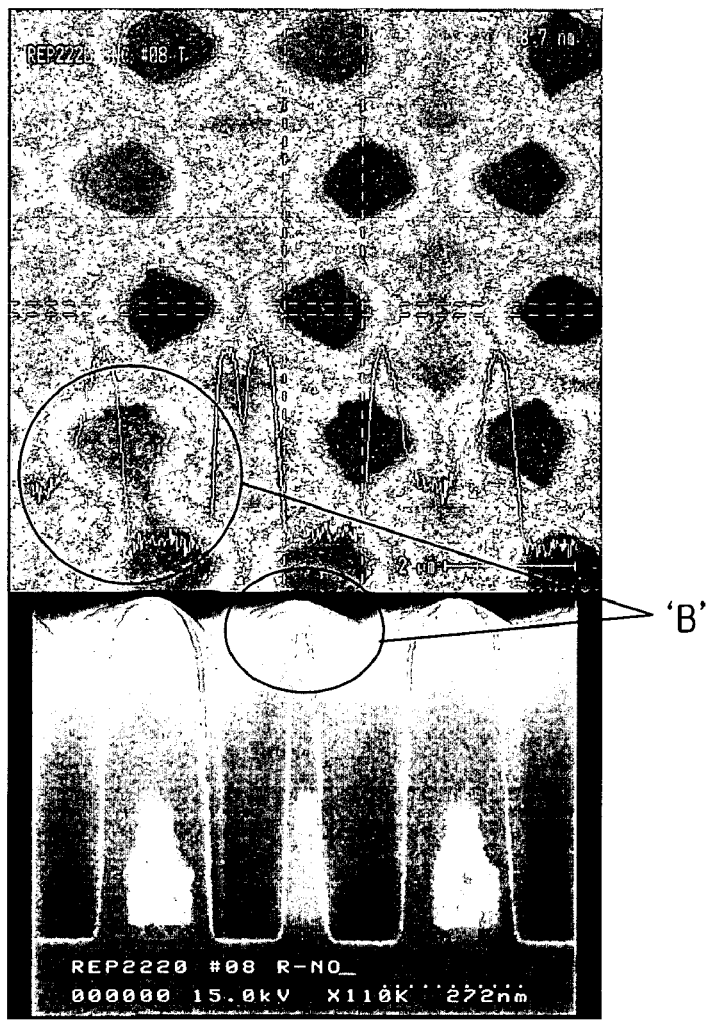

Referring to FIG. 3B, when using a nitride-based layer as the hard mask for forming the storage node contact, a sloped profile may be obtained. However, the line width of the storage node contact holes 33 may become larger than a line width defined during the SAC etching process of the storage node contact holes 33. Accordingly, a bridge 'B' may be generated between adjacent storage node contact holes 33, making it difficult to increase the line width of the storage node contact holes 33.

Figure 3C:
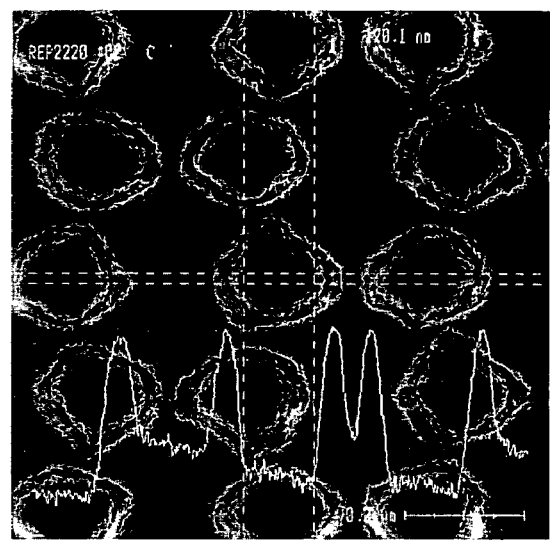

Referring to FIG. 3C, when using a photoresist pattern only as the mask for forming the storage node contact holes, a sloped profile may be formed because an abundant amount of polymer is generated, i.e., polymer rich process. However, the pattern of the storage node contact holes 33 may be deformed.

Figure 3D:
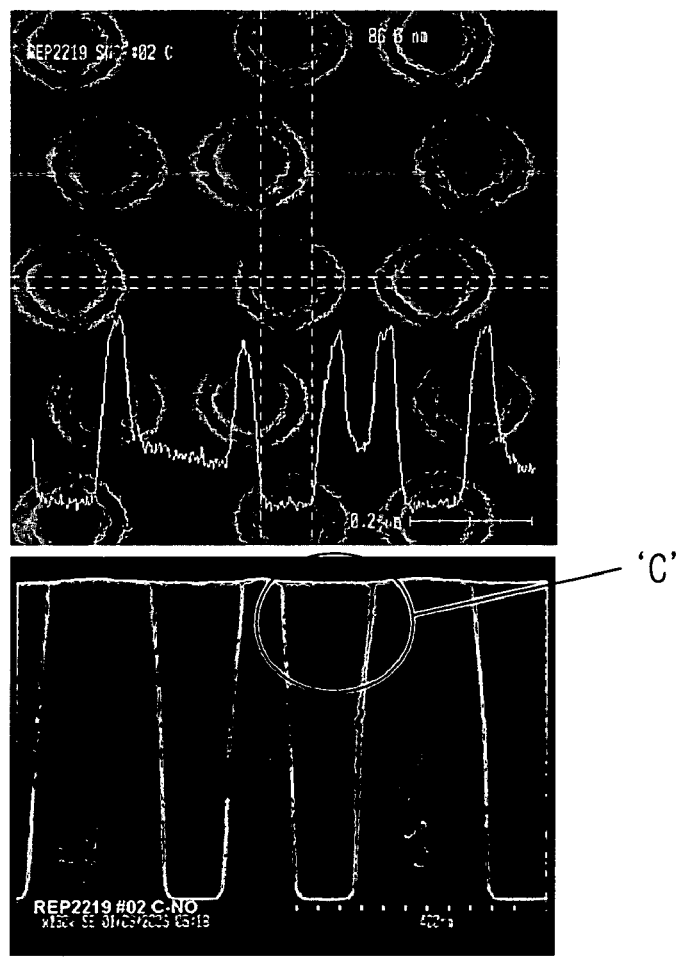

Referring to FIG. 3D, the sloped profile may be formed by employing the amorphous carbon hard mask 30A using the polymer rich characteristic without increasing the upper line width of the storage node contact holes 33, due to increased selectivity between amorphous carbon and oxide during the SAC etching process. Thus, the amorphous carbon hard mask 30A may be used as the hard mask for forming the storage node contact holes 33 having the profile of the upper line width formed larger than the bottom line width (refer to 'C').

In accordance with the embodiments of the present invention, the upper line width of the storage node contact holes may be increased to increase the overlap margin between the storage nodes and the storage node contact plugs. Also, the bottom line width of the storage node contact holes may be formed smaller than the upper line width of the storage node contact holes to maintain the contact margin between the storage node contact plugs and the landing plug isolation layer. Consequently, the etch loss of the landing plug isolation layer may be reduced. Using the aforementioned method for forming the storage node contact plugs may allow omitting a typical poly pad formation process performed to increase the contact margin between the storage node contact plugs and the storage nodes. Thus, the number of process steps may be decreased.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a contact plug in a semiconductor device, comprising:
   forming an insulation layer over a substrate, the insulation layer including a landing plug;
   forming an amorphous carbon layer over the insulation layer;
   forming a photoresist pattern over the amorphous carbon layer;
   etching the amorphous carbon layer and a certain thickness of the insulation layer using the photoresist pattern as an etch barrier to form an amorphous carbon hard mask and a remaining insulation layer, respectively;
   removing the photoresist pattern;
   etching the remaining insulation layer using the amorphous carbon hard mask to form a storage node contact hole exposing the landing plug; and
   forming a conductive material in the storage node contact hole to form a storage node contact plug,
   wherein an upper portion of the storage node contact hole includes a vertical profile, and a lower portion beneath the upper portion of the storage node contact hole includes a sloped profile.

2. The method of claim 1, wherein etching the remaining insulation layer comprises supplying a power ranging from approximately 1,000 W to approximately 2,000 W at a pressure ranging from approximately 15 mT to approximately 50 mT.

3. The method of claim 2, wherein etching the remaining insulation layer comprises using a gas selected from a group consisting of $C_4F_8$, $C_4F_8$, $C_4F_6$, and $CH_2F_2$.

4. The method of claim 3, wherein a gas mixture comprising argon (Ar)/oxygen ($O_2$)/carbon monoxide (CO)/nitrogen ($N_2$) is added to the gas selected from the group consisting of $C_4F_8$, $C_5F_8$, $C_4F_6$, and $CH_2F_2$.

5. The method of claim 1, wherein the storage node contact hole comprises a structure having an upper line width larger than a bottom line width.

6. The method of claim 1, wherein etching the amorphous carbon layer comprises supplying a power ranging from approximately 200 W to approximately 2,000 W at a pressure ranging from approximately 10 mT to approximately 200 mT.

7. The method of claim 6, wherein etching the amorphous carbon layer comprises using an etch gas including tetrafluoromethane ($CF_4$)/fluoroform ($CHF_3$).

8. The method of claim 7, wherein a gas mixture comprising $O_2$/$N_2$/Ar is added to the etch gas including $CF_4$/$CHF_3$.

9. The method of claim 1, wherein the amorphous carbon layer is formed to a thickness ranging from approximately 1,000 Å to approximately 2,000 Å.

10. The method of claim 1, wherein the insulation layer exposed by the etched amorphous carbon layer is etched to a thickness ranging from approximately 500 Å to approximately 1,500 Å.

* * * * *